United States Patent
Lee et al.

(10) Patent No.: US 10,770,020 B2
(45) Date of Patent: Sep. 8, 2020

(54) DISPLAY PANEL

(71) Applicant: SAMSUNG DISPLAY CO., LTD., Yongin-si, Gyeonggi-do (KR)

(72) Inventors: Jae-Hoon Lee, Seoul (KR); Seung-Hwan Moon, Asan-si (KR); Yong-Soon Lee, Cheonan-si (KR); Young-Su Kim, Daegu (KR); Chang-Ho Lee, Seoul (KR); Whee-Won Lee, Seoul (KR); Jun-Yong Song, Busan (KR); Yu-Han Bae, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 16/553,642

(22) Filed: Aug. 28, 2019

(65) Prior Publication Data
US 2019/0392775 A1   Dec. 26, 2019

Related U.S. Application Data

(63) Continuation of application No. 15/613,698, filed on Jun. 5, 2017, now Pat. No. 10,403,221, which is a (Continued)

(30) Foreign Application Priority Data

Nov. 26, 2009   (KR) .................. 10-2009-0115171

(51) Int. Cl.
G09G 3/36     (2006.01)
G11C 19/00    (2006.01)
G11C 19/28    (2006.01)

(52) U.S. Cl.
CPC ........... *G09G 3/3677* (2013.01); *G11C 19/28* (2013.01); *G09G 2300/0408* (2013.01);
(Continued)

(58) Field of Classification Search
CPC . G11C 19/00; G09G 3/36; G09G 5/00; G06F 3/038; H03K 17/16; H03K 3/00; H03K 19/094
See application file for complete search history.

(56) References Cited

U.S. PATENT DOCUMENTS 5,859,630 A   1/1999  Huq
5,949,398 A   9/1999  Kim
(Continued)

FOREIGN PATENT DOCUMENTS

CN   1240043 A      12/1999
CN   100389452 C    5/2008
(Continued)

OTHER PUBLICATIONS

Office Action dated Apr. 3, 2013, in Corresponding U.S. Appl. No. 12/949,931.
(Continued)

*Primary Examiner* — Chanh D Nguyen
*Assistant Examiner* — Nguyen H Truong
(74) *Attorney, Agent, or Firm* — F. Chau & Associates, LLC

(57) ABSTRACT

A display panel includes an amorphous silicon gate driver in which a lower voltage than the gate-off voltage output from the gate driver is applied to an adjacent stage as a low voltage transmission signal.

32 Claims, 11 Drawing Sheets

Related U.S. Application Data continuation of application No. 12/949,931, filed on Nov. 19, 2010, now Pat. No. 9,672,782.

(52) U.S. Cl.
CPC ............... *G09G 2310/0267* (2013.01); *G09G 2310/0286* (2013.01); *G09G 2330/021* (2013.01)

(56) References Cited

U.S. PATENT DOCUMENTS

| | | | |
|---|---|---|---|
| 6,392,627 | B1 | 5/2002 | Maekawa |
| 7,688,934 | B2 | 3/2010 | Tsai et al. |
| 8,019,039 | B1 | 9/2011 | Tsai |
| 9,672,782 | B2 | 6/2017 | Lee et al. |
| 2007/0086558 | A1 | 4/2007 | Wei et al. |
| 2007/0296681 | A1 | 12/2007 | Kim et al. |
| 2008/0079701 | A1 | 4/2008 | Shin et al. |
| 2008/0278214 | A1* | 11/2008 | Yoon ................... G09G 3/3677 327/379 |
| 2009/0189677 | A1 | 7/2009 | Lee et al. |
| 2009/0304138 | A1* | 12/2009 | Tsai ....................... G11C 19/28 377/79 |
| 2017/0270885 | A1 | 9/2017 | Lee et al. |

FOREIGN PATENT DOCUMENTS

| | | |
|---|---|---|
| CN | 101877202 | 11/2010 |
| JP | 2007-114781 | 5/2007 |
| JP | 2010-262296 | 11/2010 |
| KR | 10-2005-0003479 | 1/2005 |
| KR | 10-2005-0067040 | 6/2005 |
| KR | 1020070074826 | 7/2007 |
| KR | 1020080030212 * | 4/2008 |
| KR | 1020090081850 | 7/2009 |
| KR | 1020090115027 | 11/2009 |

OTHER PUBLICATIONS

Office Action dated Dec. 13, 2013, in Corresponding U.S. Appl. No. 12/949,931.

Notice of Allowance dated Apr. 17, 2019 in Corresponding U.S. Appl. Serial No. 15/613,698.

* cited by examiner

DISPLAY PANEL

CROSS-REFERENCE TO RELATED APPLICATION

This application is a continuation application of co-pending U.S. application Ser. No. 15/613,698 filed Jun. 5, 2017, which is a continuation of U.S. application Ser. No. 12/949,931 filed Nov. 19, 2010, issued as U.S. Pat. No. 9,672,782 on Jun. 6, 2017, which claims priority to and the benefit of Korean Patent Application No. 10-2009-0115171 filed in the Korean Intellectual Property Office on Nov. 26, 2009, the entire contents of which are incorporated by reference herein.

BACKGROUND

(a) Technical Field

The present disclosure relates to display panels, and, more particularly, to a display panel having a gate driver integrated therein.

(b) Discussion of the Related Art

As one of a group of widely used display panels, a liquid crystal display (LCD) includes two display panels provided with field generating electrodes such as pixel electrodes and a common electrode, and a liquid crystal layer interposed therebetween. The LCD displays images by applying voltages to the field-generating electrodes to generate an electric field in the LC layer that determines the orientation of LC molecules therein to adjust the polarization of incident light. Organic light emitting devices, plasma display devices, and electrophoretic displays, as well as LCDs, are examples of such widely used display panels.

These display devices include a gate driver and a data driver. The gate driver can be integrated on the panel by being patterned along with a gate line, a data line, and a thin film transistor. A separate gate driving chip can be avoided by forming an integrated gate driver, thereby reducing manufacturing cost. However, thin film transistors formed inside the integrated gate driver can generate leakage current while the gate off signal is output such that undesired increased power consumption occurs.

Also, the characteristics of the semiconductor (particularly an amorphous semiconductor) of the thin film transistor are changeable according to temperature, and as a result, gate voltage output at high temperature does not have a uniform waveform and noise is generated.

SUMMARY

In accordance with an exemplary embodiment of the present invention power consumption of a gate driver integrated in a display panel is reduced and a gate voltage having a uniform waveform at high temperature is output.

According to an exemplary embodiment a display panel includes a display area having a gate line. A gate driver is connected to one end of the gate line, the gate driver including a plurality of stages and integrated on a substrate. The stages receive a clock signal, a first low voltage and a second low voltage that is lower than the first low voltage, at least one transmission signal from a previous stage, and at least two transmission signals from a next stage to output a gate voltage having a first low voltage as a gate-off voltage.

The gate voltage when the transmission signal is low may be the second low voltage.

At least one transmission signal applied to a first stage may be a scanning start signal.

The display area may include a data line. The display panel may include a data driver that supplies a data voltage which is applied to the data line. The data driver may be formed at an upper side or a lower side of the display panel.

The stages may include an input section, a pull-up driver, a pull-down driver, an output section, and a transmission signal generator.

The input section, the pull-down driver, the output section, and the transmission signal generator may be connected to a first node.

The input section may be connected between a first input terminal input that receives at least one transmission signal from the previous stage and the first node.

The output section may be connected between a gate voltage output terminal that outputs the gate voltage, a clock input terminal input with the clock signal, and the first node, such that the gate voltage is output according to the voltage of the first node.

The transmission signal generator may be connected between a transmission signal output terminal that outputs the transmission signal, the clock input terminal, and the first node, such that the transmission signal is output according to the voltage of the first node.

The pull-up driver and the pull-down driver may be connected to a second node.

The pull-down driver may be connected to each terminal that inputs at least two transmission signals from the next stage, which are the first low voltage and the second low voltage, the transmission signal output terminal, and the gate voltage output terminal, and is also connected to the first node and the second node.

The pull-down driver may include an element that pulls down the first node, an element that pulls down the second node, an element that pulls down the transmission signal output terminal, and an element that pulls down the gate voltage output terminal.

The element that pulls down the first node may decrease the voltage of the first node to the second low voltage according to one of at least two transmission signals from the next stage and the voltage of the second node voltage.

Decreasing of the voltage of the first node to the second low voltage according to one transmission signal of at least two transmission signals from the next stage may be executed through a first transistor having a control terminal that receives one transmission signal of at least two transmission signals from the next stage and an input terminal connected to the first node, and a second transistor having a control terminal and an input terminal connected to an output terminal of the first transistor and an output terminal connected to the second low voltage.

The element that pulls down the second node may decrease the voltage of the second node to the second low voltage according to at least one transmission signal from the previous stage or the transmission signal of the corresponding stage.

The element that pulls down the second node may decrease the voltage of the second node to the second low voltage according to at least one transmission signal from the previous stage, and decreases the voltage of the second node to the first low voltage according to the transmission signal of the corresponding stage.

The element that pulls down the transmission signal output terminal ma decrease the voltage of the transmission signal output terminal to the second low voltage according to the voltage of the second node.

The element that pulls down the transmission signal output terminal ma decrease the voltage of the transmission signal output terminal to the second low voltage according to one of at least two transmission signals from the next stage.

The element that pulls down the gate voltage output terminal may decrease the voltage of the gate voltage output terminal to the first low voltage according to the voltage of the second node or one of at least two transmission signals from the next stage.

The pull-up driver may be connected to the clock input terminal, the pull-down driver, and the second node.

At least one transmission signal from the previous stage may the transmission signal of the neighboring previous stage, or at least two transmission signals from the next stage may be the transmission signals of two next stages that continuously neighbor each other.

According to an exemplary embodiment of the present invention, the circuit of each stage is decreased to a lower potential than the gate-off voltage such that the current leakage is reduced, thereby obtaining the low power consumption, and a ripple applied through the transmission signal may be reduced at a high temperature such that a uniform gate-on voltage may be output at a high temperature. Also, although the further lower voltage is applied at the low temperature, it is possible to operate it and the lifespan is increased.

DETAILED DESCRIPTION

Figure 1:
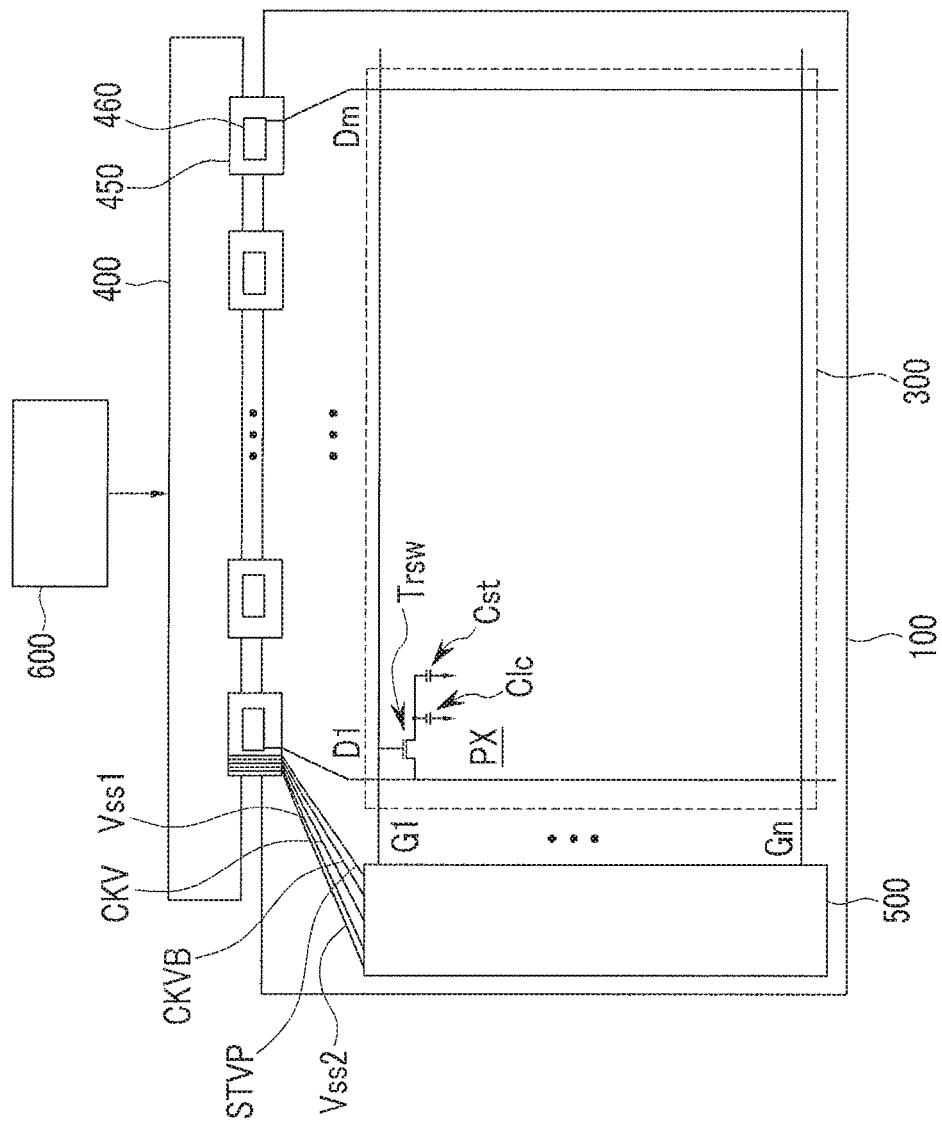
FIG. 1 is a plan view of a display panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways without departing from the spirit or scope of the present invention.

Like reference numerals designate like elements throughout the specification and drawings.

Referring to FIG. 1, a display panel 100 according to an exemplary embodiment of the present invention includes a display area 300 displaying images, and a gate driver 500 applying a gate voltage to a gate line of the display area 300. A data line of the display area 300 receives a data voltage from a data driver IC 460 formed on a flexible printed circuit film (FPC) 450 attached to the display panel 100. The gate driver 500 and the data driver IC 460 are controlled by a signal controller 600. A printed circuit board (PCB) 400 is formed outside the flexible printed circuit film 450, and transmits the signal from the signal controller 600 to the data driver IC 460 and the gate driver 500. The signal provided from the signal controller 600 may include a signal such as a first clock signal CKV, a second clock signal CKVB, a scan start signal STVP, and a signal providing low voltages Vss1, Vss2 of a particular level.

FIG. 1 shows an example of the liquid crystal panel. When the display area 300 is a liquid crystal panel, the display area includes a thin film transistor Trsw, a liquid crystal capacitor Clc, and a storage capacitor Cst, and. On the other hand, the display area 300 for an organic light emitting panel includes a thin film transistor and an organic light emitting diode, and the display area 300 for other display panels includes elements such as a thin film transistor. Hereinbelow, an exemplary embodiment of a liquid crystal panel will be described in more detail.

The display area 300 includes a plurality of gate lines G1, . . . Gn and a plurality of data lines D1, . . . Dm. The plurality of gate lines G1, . . . Gn and the plurality of data lines D1, . . . Dm are insulated from and intersect each other.

Each pixel PX includes the thin film transistor Trsw, the liquid crystal capacitor Clc, and the storage capacitor Cst. The control terminal of the thin film transistor Trsw is connected to one gate line, the input terminal of the thin film transistor Trsw is connected to one data line, and the output terminal of the thin film transistor Trsw is connected to one terminal of the liquid crystal capacitor Clc and one terminal of the storage capacitor Cst. The other terminal of the liquid crystal capacitor Clc is connected to the common electrode, and the other terminal of the storage capacitor Cst receives a storage voltage Vcst applied from the signal controller 600.

The plurality of data lines D1, . . . Dm receive the data voltages from the data driver IC 460, and the plurality of gate lines G1, . . . Gn receive the gate voltage from the gate driver 500.

The data driver IC 460 is formed at the upper side or the lower side of the display panel 100 thereby being connected to the data lines D1, . . . Dm extended in the longitudinal direction. In the exemplary embodiment depicted in FIG. 1 the data driver IC 460 is positioned at the upper side of the display panel 100.

The gate driver 500 receives the clock signals CKV, CKVB, the scan start signal STVP, the first low voltage Vss1 conforming to the gate-off voltage, and the second low voltage Vss2 that is less than the gate-off voltage to generate gate voltages (a gate-on voltage and a gate-off voltage) and sequentially apply the gate-on voltage to the gate lines G1, . . . Gn.

The clock signals CKV, CKVB, the scan start signal STVP, the first low voltage Vss1, and the second low voltage Vss2 applied to the gate driver 500 are applied to the gate driver 500 through the flexible printed circuit film 450 positioned at the outmost side and the side of the gate driver 500, as shown in FIG. 1. These signals are transmitted to the flexible printed circuit film 450 through the printed circuit board PCB 400 from the signal controller 600, or, in an alternative embodiment, from externally.

Next, the detailed description will focus on an exemplary embodiment of the gate driver 500 and the gate lines G1, . . . Gn.

Figure 2:
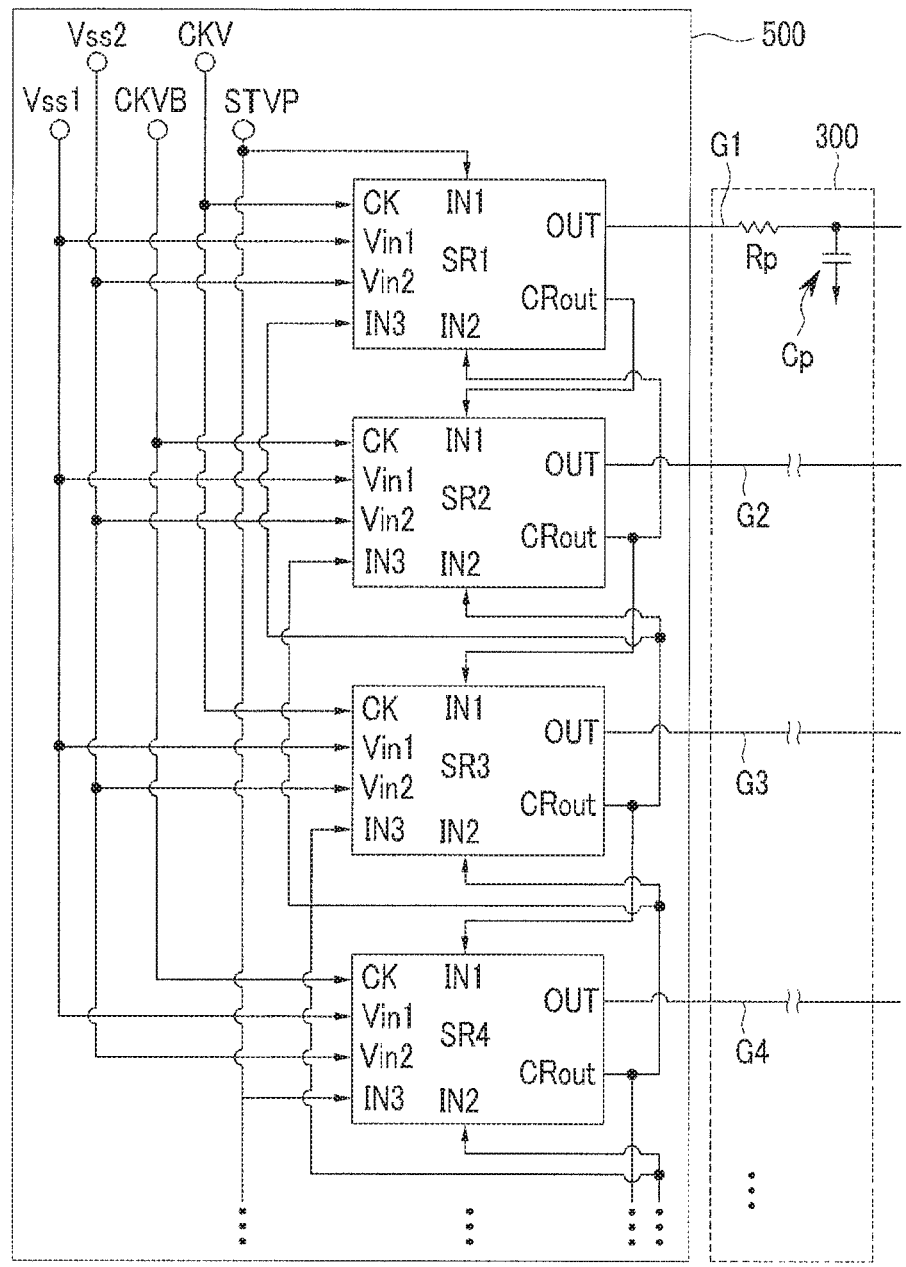
FIG. 2 is a block diagram showing the gate driver and the gate line of FIG. 1 in further detail.

FIG. 2 is a block diagram showing the gate driver and the gate lines of FIG. 1 in further detail. The display area 300 is shown to have a resistor Rp and a capacitor Cp. The gate lines G1, . . . Gn, the liquid crystal capacitor Clc, and the storage capacitor Cst respectively have resistances and capacitances, and their sums are represented as one resistance Rp and one capacitance Cp. The gate voltage output from the stage SR is transmitted through the gate lines. As shown in FIG. 2, the gate line may be represented as the resistance Rp and the capacitance Cp in a circuit diagram. These values depict a representative value for one gate line, but may change according to the structure and the characteristics of the display area 300.

The gate driver 500 includes a plurality of stages SR1, SR2, SR3, SR4, . . . that are dependently connected to each other. Each of the stages SR1, SR2, SR3, SR4, . . . includes three input terminals IN1, IN2, IN3, one clock input terminal CK, two voltage input terminals Vin1, Vin2, a gate voltage output terminal OUT that outputs the gate voltage, and a transmission signal output terminal CRout.

The first input terminal IN1 is connected to the transmission signal output terminal CRout of the previous stage thereby receiving the transmission signal CR of the previous stage. However, the first stage does not have a previous stage such that the scan start signal STVP at the first input terminal IN1 is applied.

The second input terminal IN2 is connected to the transmission signal output terminal CRout of the next stage thereby receiving the transmission signal CR of the next stage. Also, the third input terminal IN3 is connected to the transmission signal output terminal CRout of the second next stage thereby receiving the transmission signal CR of the second next stage.

A stage SRn (not shown) connected to the n-th gate line Gn may have two dummy stages to receive the transmission signal CR from the next stage and the second next stage. The dummy stages (SRn+1, SRn+2; not shown) are stages that generate and output a dummy gate voltage, different from the stages SR1, SR2, SR3, SR4, . . . SRn. That is, the gate voltage output from the stages SR1, SR2, SR3, SR4, . . . SRn is transmitted though the gate lines such that the data voltage is applied to the pixel for the display of the images, however the dummy stages SRn+1, SRn+2 would not be connected to the gate lines, although when they are connected to the gate lines, they are connected to the gate lines of a dummy pixel (not shown) that do not display the image such that they would not be used for the display of the image.

The clock terminals CK are applied with a clock signal, and among the plurality of stages, the clock terminals CK of the odd-numbered stages are applied with the first clock signal CKV and the clock terminals CK of the even-numbered stages are applied with the second clock signal CKVB. The first clock signal CKV and the second clock signal CKVB have opposite phases to each other.

The first voltage input terminal Vin1 is applied with the first low voltage Vss1 corresponding to the gate-off voltage, and the second voltage input terminal Vin2 is applied with the second low voltage Vss2 that is lower than the first low voltage Vss1. The voltage values of the first low voltage Vss1 and the second low voltage Vss2 may vary according to the particular exemplary embodiment. In the present exemplary embodiment the value of the first low voltage Vss1 is −5V and the value of the second low voltage Vss2 is −10V.

The operation of the gate driver 500 will now be described in more detail.

The first stage SR1 receives the first clock signal CKV provided from outside to the clock input terminal CK, the scan start signal STVP through the first input terminal IN1, the first and second low voltages Vss1, Vss2 through the first and second voltage input terminals Vin1, Vin2, and the transmission signals CR respectively provided from the second stage SR2 and the third stage SR3 through the second and third input terminals IN2, IN3 such that the gate-on voltage is output to the first gate line through the gate voltage output terminal OUT. Also, the transmission signal output terminal CRout outputs the transmission signal CR, and it is transmitted to the first input terminal IN1 of the second stage SR2.

The second stage SR2 receives the second clock signal CKVB provided from outside to the clock input terminal CK, the transmission signal CR of the first stage SR1 through the first input terminal IN1, the first and second low voltages Vss1, Vss2 through the first and second voltage input terminals Vin1, Vin2, and the transmission signals CR respectively provided from the third stage SR3 and the fourth stage SR4 through the second and third input terminals IN2, IN3 such that the gate-on voltage is output to the second gate line through the gate voltage output terminal OUT. Also, the transmission signal CR is output through the transmission signal output terminal CRout thereby being transmitted to the first input terminal IN1 of the third stage SR3 and the second input terminal IN2 of the first stage SR1.

The third stage SR3 receives the first clock signal CKV provided from outside to the clock input terminal CK, the transmission signal CR of the second stage SR2 through the first input terminal IN1, the first and second low voltages Vss1, Vss2 through the first and second voltage input terminals Vin1, Vin2, and the transmission signals CR respectively provided from the fourth stage SR4 and the fifth stage SR5 through the second and third input terminals IN2, IN3 such that the gate-on voltage is output to the third gate line through the gate voltage output terminal OUT. Also, the transmission signal CR is output through the transmission signal output terminal CRout thereby being transmitted to the first input terminal IN1 of the fourth stage SR4, the third input terminal IN3 of the first stage SR1, and the second input terminal IN2 of the second stage SR2.

Through the above method, the n-th stage SRn receives the second clock signal CKVB provided from the outside to the clock input terminal CK, the transmission signal CR of the n−1-th stage SRn-1 through the first input terminal IN1, the first and second low voltages Vss1, Vss2 through the first and second voltage input terminals Vin1, Vin2, and the transmission signals CR respectively provided from the (n+1)-th stage SRn+1 (the dummy stage) and the (n+2)-th stage SRn+2 (the dummy stage) through the second and third input terminals IN2, IN3 such that the gate-on voltage is output to the n-th gate line through the gate voltage output terminal OUT. Also, the transmission signal CR is output through the transmission signal output terminal CRout thereby being transmitted to the first input terminal IN1 of the (n+1)-th stage SRn+1 (the dummy stage), the third input terminal IN3 of the (n−2)-th stage SRn-2, and the second input terminal IN2 of the (n−1)-th stage SRn-1.

The connection structure of the stages SR of the gate driver 500 has been described with reference to FIG. 2. Next, the structure of an exemplary embodiment of a representative stage SR of a gate driver connected to one gate line will be described in further detail with reference to FIG. 3.

Figure 3:
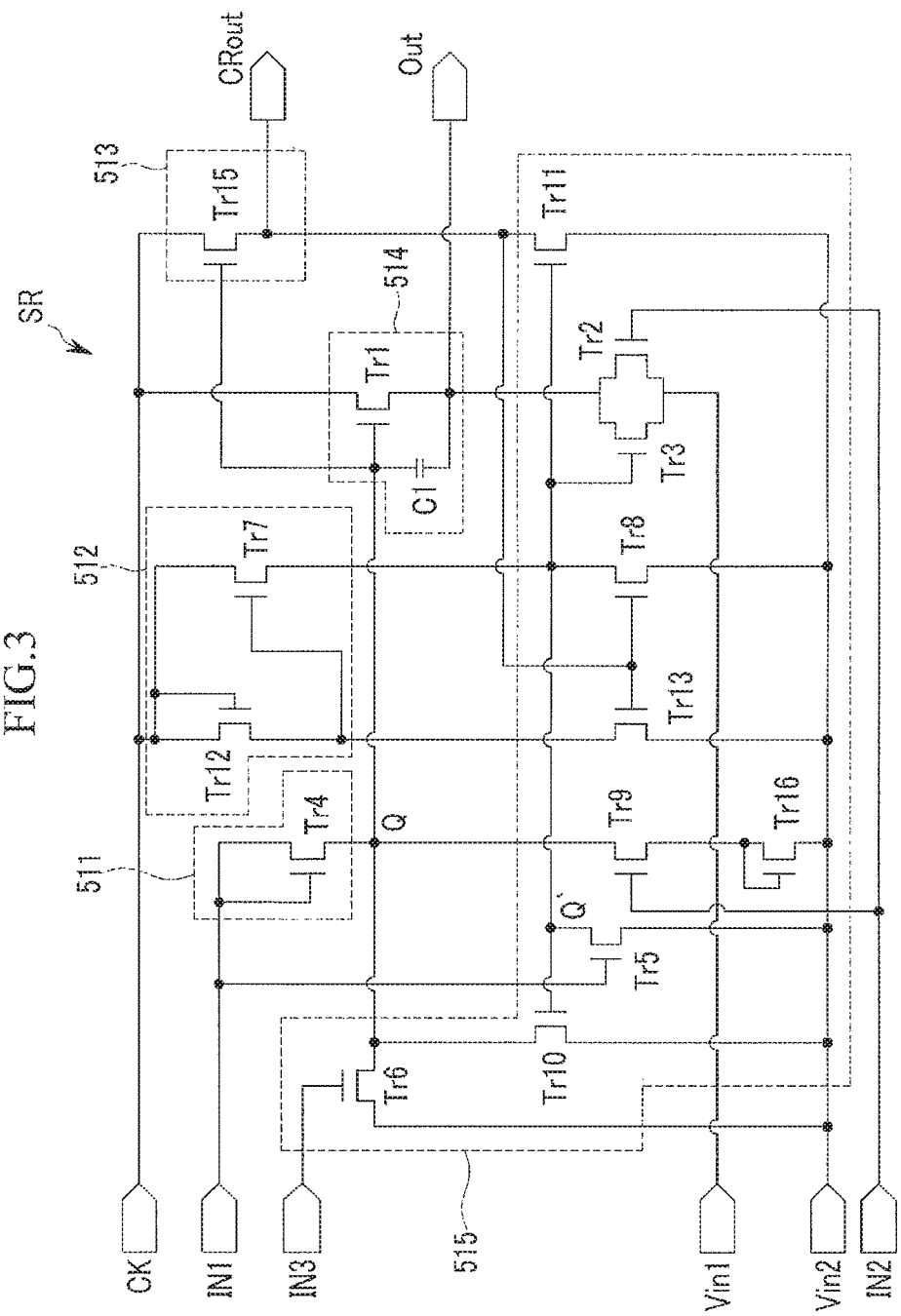
FIG. 3 is a circuit diagram of one stage and one gate line in FIG. 2.

FIG. 3 is a circuit diagram of one stage SR and one gate line in FIG. 2. Each stage SR of the gate driver 500 according to the present exemplary embodiment includes an input section 511, a pull-up driver 512, a transmission signal generator 513, an output section 514, and a pull-down driver 515.

The input section 511 includes one transistor (the fourth transistor Tr4). The input terminal and the control terminal of the fourth transistor Tr4 are commonly connected (diode-connected) to the first input terminal IN1. The output terminal thereof is connected to a node Q (hereinafter referred to as the first node). The input section 511 has the function of transmitting the high voltage to the node Q when the first input terminal IN1 is applied with the high voltage.

The pull-up driver 512 includes two transistors (the seventh transistor Tr7 and the twelfth transistor Tr12. The control terminal and the input terminal of the twelfth transistor Tr12 are diode-connected thereby receiving the first clock signal CKV or the second clock signal CKVB through the clock terminal CK, and the output terminal is connected to the control terminal of the seventh transistor Tr7 and the pull-down driver 515. The input terminal of the seventh transistor Tr7 is also connected to the clock terminal CK. The output terminal is connected to the node Q' (hereinafter referred to as the second node) and is passed through the node Q' thereby being connected to the pull-down driver 515. The control terminal of the seventh transistor Tr7 is connected to the output terminal of the twelfth transistor Tr12 and the pull-down driver 515. Here, a parasitic capacitor (not shown) may be respectively formed between the input terminal and the control terminal, and the control terminal and the output terminal, of the seventh transistor Tr7. If the pull-up driver 512 is applied with the high signal at the clock terminal CK, the high signal is transmitted to the control terminal of the seventh transistor Tr7 and the pull-down driver 515 through the twelfth transistor Tr12. The high signal transmitted to the seventh transistor Tr7 turns on the seventh transistor Tr7, and as a result the high signal applied from the clock terminal CK is applied to the node Q'.

The transmission signal generator 513 includes one transistor (the fifteenth transistor Tr15). The input terminal of the fifteenth transistor Tr15 is connected to the clock terminal CK thereby receiving the first clock signal CKV or the second clock signal CKVB. The control terminal thereof is connected to the output terminal of the input section 511, that is, the node Q. The output terminal thereof is connected to the transmission signal output terminal CRout that outputs the transmission signal CR. Here, a parasitic capacitor (not shown) may be formed between the control terminal and the output terminal. The output terminal of the fifteenth transistor Tr15 is connected to the pull-down driver 515 as well as the transmission signal output terminal CRout, thereby receiving the second low voltage Vss2. As a result, the voltage value when the transmission signal CR is low is the second low voltage Vss2.

The output section 514 includes one transistor (the first transistor Tr1) and one capacitor (the first capacitor C1). The control terminal of the first transistor Tr1 is connected to the node Q. The input terminal thereof receives the first clock signal CKV or the second clock signal CKVB through the clock terminal CK. The first capacitor C1 is formed between the control terminal and the output terminal. The output terminal thereof is connected to the gate voltage output terminal OUT. Also, the output terminal is connected to the pull-down driver 515 thereby receiving the first low voltage Vss1. As a result, the value of the voltage of the gate-off voltage is the first low voltage Vss1. This output section 514 outputs the gate voltage according to the voltage of the node Q and the first clock signal CKV.

The pull-down driver 515 removes charges remaining at the stage SR as a portion to smoothly output the gate-off voltage and the low voltage of the transmission signal CR thereby executing functions of decreasing the potential of the node Q, the potential of the node Q', the voltage output to the transmission signal CRout, and the voltage output to the gate line. The pull-down driver 515 includes ten transistors (the second transistor Tr2, the third transistor Tr3, the fifth transistor Try, the sixth transistor Tr6, the eighth transistor Tr8 to the eleventh transistor Tr11, the thirteenth transistor Tr13 and the sixteenth transistor Tr16).

The transistors that pull down the node Q will be first described. The transistors that pull down the node Q are the sixth transistor Tr6, the ninth transistor Tr9, the tenth transistor Tr10, and the sixteenth transistor Tr16.

The control terminal of the sixth transistor Tr6 is connected to the third input terminal IN3. The output terminal thereof is connected to the second voltage input terminal Vin2. The input terminal thereof is connected to the node Q. Therefore, the sixth transistor Tr6 is turned on according to the transmission signal CR applied from the second next stage, thereby having the function of decreasing the voltage of the node Q to the second low voltage Vss2.

The ninth transistor Tr9 and the sixteenth transistor Tr16 are operated together thereby pulling down the node Q. The control terminal of the ninth transistor Tr9 is connected to the second input terminal IN2. The input terminal thereof is connected to the node Q. The output terminal thereof is connected to the input terminal and the control terminal of the sixteenth transistor Tr16. The control terminal and the input terminal of the sixteenth transistor Tr16 are diode-connected to the output terminal of the ninth transistor Tr9. The output terminal thereof is connected to the second voltage input terminal Vin2. Therefore, the ninth transistor Tr9 and the sixteenth transistor Tr16 are turned on according to the transmission signal CR applied from the next stage, thereby executing the function of decreasing the voltage of the node Q to the second low voltage Vss2.

The input terminal of the tenth transistor Tr10 is connected to the node Q, the output terminal thereof is connected to the second voltage input terminal Vin2, and the control terminal thereof is connected to the node Q' (which has the reverse voltage to the node Q such that it is referred to as a reverse terminal). Therefore, the tenth transistor Tr10 has the function of continuously decreasing the voltage of the node Q to the second low voltage Vss2 in the general period when the node Q' has the high voltage and then not decreasing the voltage of the node Q when the voltage of the node Q' is only the low voltage. When the voltage of the node Q is not decreased, the corresponding stage outputs the gate-on voltage and the transmission signal CR.

The transistors that pull down the node Q' in the pull-down driver 515 will now be described. The transistors that pull down the node Q' are the fifth transistor Tr5, the eighth transistor Tr8, and the thirteenth transistor Tr13.

The control terminal of the fifth transistor Tr5 is connected to the first input terminal IN1, the input terminal thereof is connected to the node Q', and the output terminal thereof is connected to the second voltage input terminal Vin2. As a result, the fifth transistor Tr5 decreases the voltage of the node Q' to the second low voltage Vss2 according to the transmission signal CR of the previous stage.

The eighth transistor Tr8 has the control terminal connected to the transmission signal output terminal CRout of the corresponding stage, the input terminal connected to the node Q', and the output terminal connected to the second voltage input terminal Vin2. As a result, the eighth transistor Tr8 functions to decrease the voltage of the node Q' to the second low voltage Vss2 according to the transmission signal CR of the corresponding stage.

The thirteenth transistor Tr13 has the control terminal connected to the transmission signal output terminal CRout of the corresponding stage, the input terminal connected to the output terminal of the twelfth transistor Tr12 of the pull-up driver 512, and the output terminal connected to the second voltage input terminal Vin2. As a result, the thirteenth transistor Tr13 functions to decrease the inner potential of the pull-up driver 512 to the second low voltage Vss2 and decrease the voltage of the node Q' connected to the pull-up driver 512 to the second low voltage Vss2 according to the transmission signal CR of the corresponding stage. That is, the thirteenth transistor Tr13 strictly functions to discharge the inner charges of the pull-up driver 512 to the second low voltage Vss2. However, the pull-up driver 512 is also connected to the node Q' for the voltage of the node Q' to not be pulled up such that the thirteenth transistor Tr13 assists to decrease the voltage of the node Q' to the second low voltage Vss2.

The transistor decreasing the voltage output to the transmission signal CRout in the pull-down driver 515 will now be described. The transistor decreasing the voltage output to the transmission signal CRout is the eleventh transistor Tr11.

The eleventh transistor Tr11 has the control terminal connected to the node Q', the input terminal connected to the transmission signal output terminal CRout, and the output terminal connected to the second voltage input terminal Vin2. As a result, when the voltage of the node Q' is high, the voltage of the transmission signal output terminal CRout is decreased to the second low voltage Vss2 such that the transmission signal CR is changed to the low level.

The transistors decreasing the voltage output to the gate line from the pull-down driver 515 will now be described. The transistors decreasing the voltage output to the gate line are the second transistor Tr2 and the third transistor Tr3.

The second transistor Tr2 has the control terminal connected to the second input terminal IN2, the input terminal connected to the gate voltage output terminal OUT, and the output terminal connected to the first voltage input terminal Vin1. As a result, the gate voltage output when the transmission signal CR of the next stage is output is changed to the first low voltage Vss1.

The third transistor Tr3 has the control terminal connected to the node Q', the input terminal connected to the gate voltage output terminal OUT and the output terminal connected to the first voltage input terminal Vin1. As a result, the gate voltage output when the voltage of the node Q' is high is changed to the first low voltage Vss1.

In the pull-down driver 515, the gate voltage output terminal OUT is only decreased to the first low voltage Vss1, and the node Q, the node Q' and the transmission signal output terminal CRout are decreased to the second low voltage Vss2 that is lower than the first low voltage Vss1. As a result, although the gate-on voltage and the high voltage of the transmission signal CR may have the same voltage, the gate-off voltage and the low voltage of the transmission signal CR have different voltages. That is, the gate-off voltage has the first low voltage Vss1, and the low voltage of the transmission signal CR has the second low voltage Vss2.

The gate voltage and transmission signal CR may have various voltage values. However, in the present exemplary embodiment, the gate-on voltage is 25V. The gate-off voltage and the first low voltage Vss1 are −5V. The high voltage of the transmission signal CR is 25V. The low voltage and the second low voltage Vss2 are −10V. In summary, the transmission signal generator 513 and the output section 514 are operated by the voltage of the node Q such that one stage SR outputs the high voltage of the transmission signal CR and the gate-on voltage, the transmission signal CR is decreased from the high voltage to the second low voltage Vss2 by the previous, the next, and the second next transmission signals CR, and the gate-on voltage is decreased to the first low voltage Vss1 thereby being the gate-off voltage. Here, one stage SR decreases the voltage of the node Q to the second low voltage Vss2 by the second next transmission signal CR as well as the next transmission signal CR to reduce the power consumption. The second low voltage Vss2 is lower than the first low voltage Vss1 as the gate-off voltage such that the second low voltage Vss2 is sufficiently low and the transistors included in the stage hardly flow out any leakage current. There is thereby the benefit that the power consumption is decreased although the transmission signal CR applied in the different stage includes a ripple or noise such that the voltage is changed.

Figure 4:
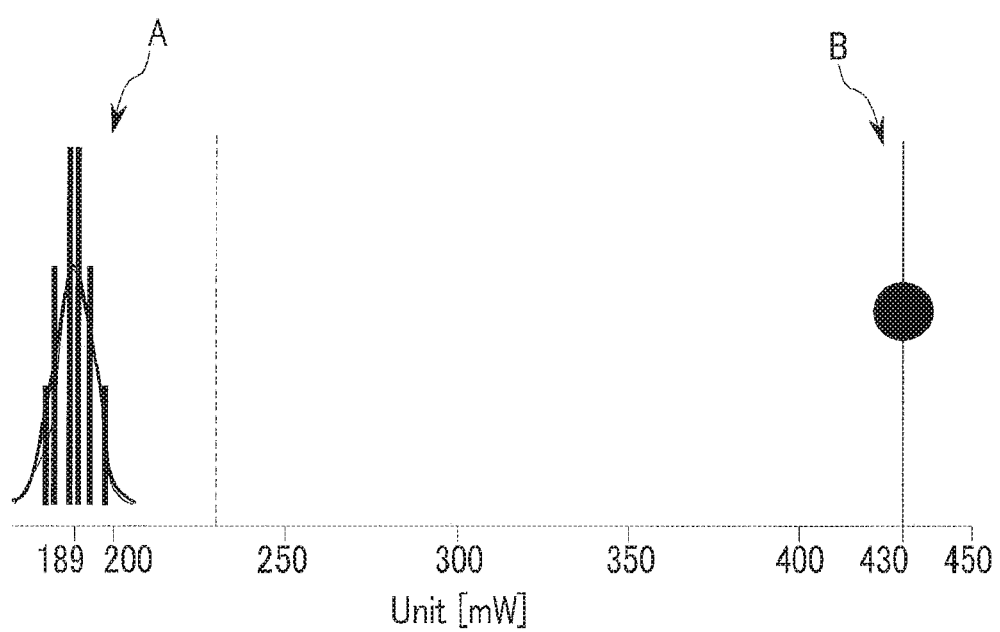
FIG. 4 is a graph comparing power consumption when using the exemplary embodiment of FIG. 3 with power consumption according to the conventional art.

FIG. 4 is a graph showing power consumption of the gate driver 500 according to the exemplary embodiment of FIG. 3. "A" depicts power consumption of the exemplary embodiment of FIG. 3, and "B" depicts power consumption of the conventional art. "A" is represented as a plurality of bar graphs, which means the results are measured through a plurality of exemplary embodiments, and 189 mW is average power consumption of the exemplary embodiment of FIG. 3. On the other hand, it is typically known that the power consumption of the gate driver according to the conventional art is 430 mW. Accordingly, the power consumption can be reduced by more than half when implementing the exemplary embodiment of the present invention.

The transistors Tr1-Tr13, Tr15, Tr16 formed in the stage SR may be NMOS transistors, when the transistors Tr1-Tr13, Tr15, Tr16 are formed as PMOS transistors. The transistors Tr1-Tr13, Tr15, Tr16 may be on when the voltage applied to the control terminal is low.

Next, a display device according to an exemplary embodiment of the present invention will be described with reference to FIGS. 5 to 7.

Figure 5:
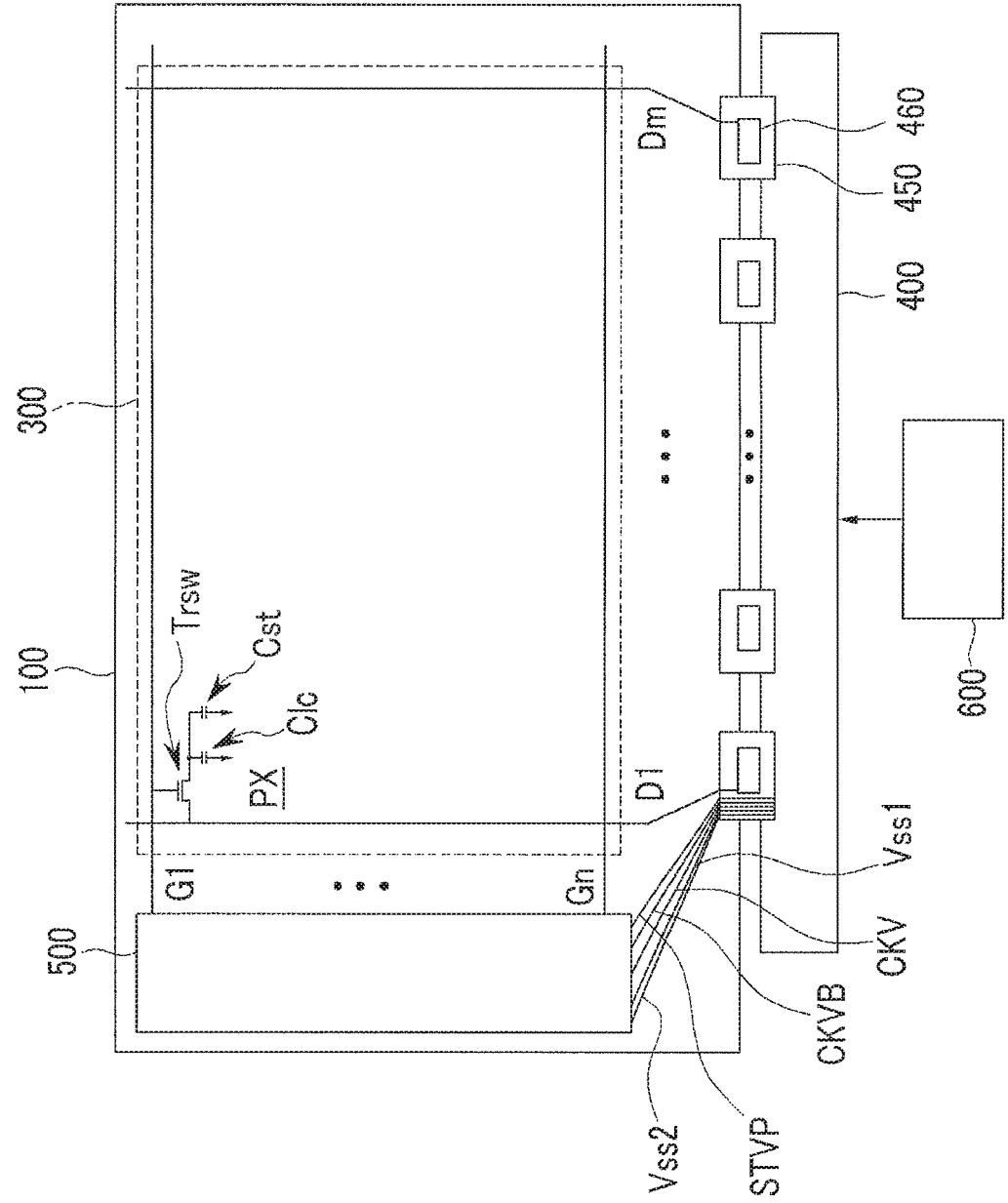
FIG. 5 is a plan view of a display panel according to an exemplary embodiment of the present invention.

FIG. 5 is a plan view of a display device according to an exemplary embodiment of the present invention and shows an exemplary embodiment in which the data driver IC 460 is formed at the lower side of the display panel 100, differently from that in FIG. 1. This does not mean that the exemplary embodiments of FIG. 6 and FIG. 7 is limited to the exemplary embodiment of FIG. 5, since the exemplary embodiments of FIG. 6 and FIG. 7 can be both applied to the exemplary embodiments of FIG. 1 and FIG. 5.

Except for the data driver IC 460 being formed at the lower side of the display panel 100, FIG. 5 is the same as FIG. 1. In the exemplary embodiment of FIG. 1, the data driver IC 460 is formed at the upper side of the display panel 100. The gate driver of FIG. 2 and FIG. 3 and the gate driver of FIG. 6 and FIG. 7 may be applied to all display devices of FIG. 1 and FIG. 5.

Figure 6:
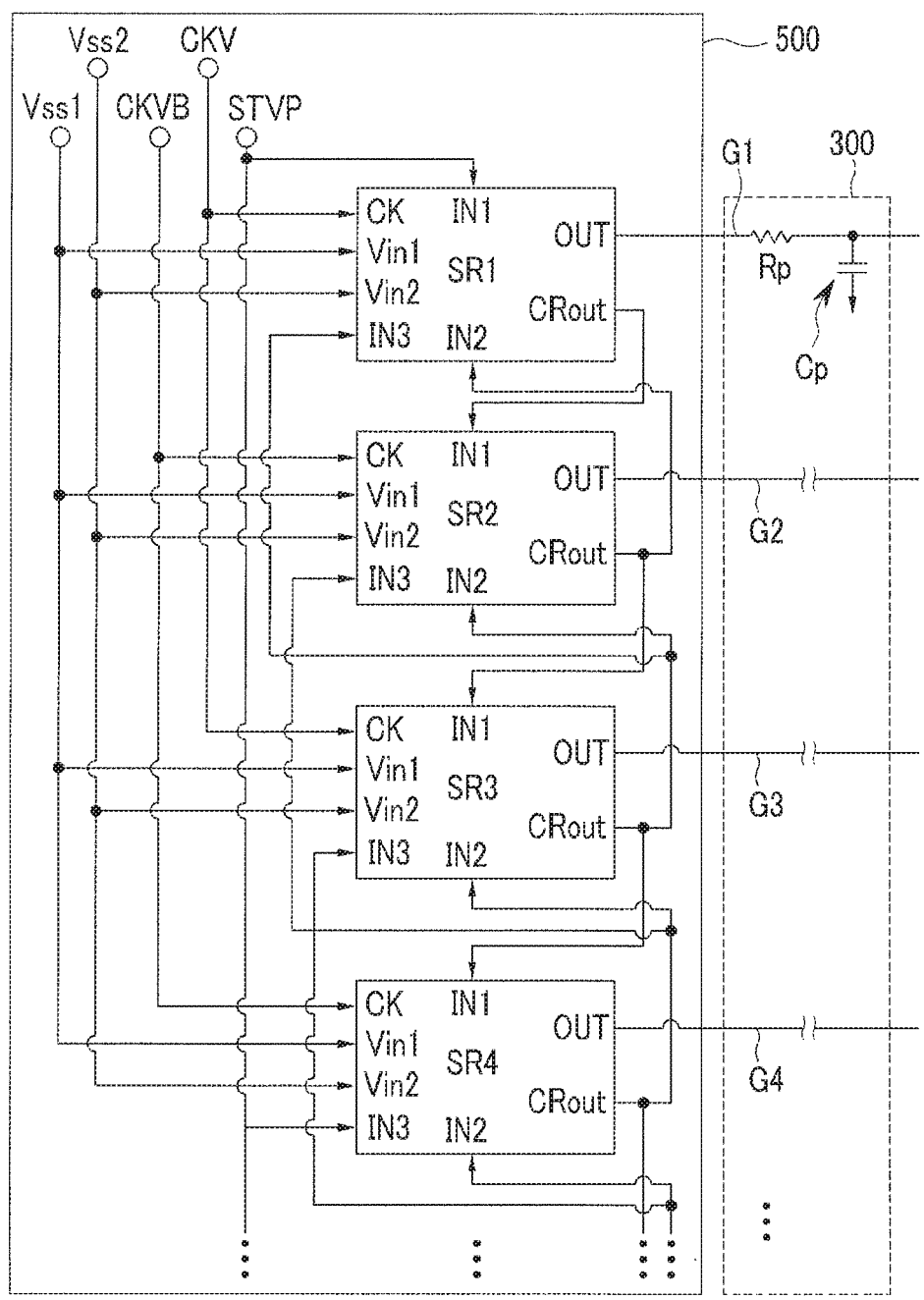
FIG. 6 is a block diagram showing the gate driver and the gate line of FIG. 5 in further detail.

FIG. 6 is a block diagram showing the gate driver and the gate line of FIG. 5 in further detail, and has the same signal characteristics as that of FIG. 2. That is, the signals input and output to each stage SR formed in the gate driver 500 are the same as those of FIG. 2.

FIG. 6 shows the connection relationship and the operation of the gate driver 500, and will be described again as follows.

The gate driver 500 includes a plurality of stages SR1, SR2, SR3, SR4, . . . that are dependently connected to each other. Each of the stages SR1, SR2, SR3, SR4, . . . includes three input terminals IN1, IN2, IN3, one clock input terminal CK, two voltage input terminals Vin1, Vin2, a gate voltage output terminal OUT that outputs the gate voltage, and a transmission signal output terminal CRout.

The first input terminal IN1 is connected to the transmission signal output terminal CRout of the previous stage thereby receiving the transmission signal CR of the previous stage. The first stage does not have the previous stage such that the scan start signal STVP of the first input terminal IN1 is applied.

The second input terminal IN2 is connected to the transmission signal output terminal CRout of the next stage, thereby receiving the transmission signal CR of the next stage. Also, the third input terminal IN3 is connected to the transmission signal output terminal CRout of the second next stage, thereby receiving the transmission signal CR of the second next stage.

The stage SRn (not shown) connected to the n-th gate line Gn may have two dummy stages to receive the transmission signal CR from the next stage and the second next stage. The dummy stages (SRn+1, SRn+2; not shown) are stages that generate and output a dummy gate voltage, differently from the stages SR1, SR2, SR3, SR4, . . . SRn. That is, the gate voltage output from the stages SR1, . . . SRn is transmitted though the gate line thereby the data voltage is applied to the pixel for the display of the images, however the dummy stages SRn+1, SRn+2 would not be connected to the gate lines, and even if they are connected to the gate lines, they are connected to the gate lines of dummy pixels (not shown) that do not display the image such that they would not be used for the display of the image.

The clock terminal CK is applied with a clock signal. Among the plurality of stages, the clock terminals CK of the odd-numbered stages are applied to the first clock signal CKV. The clock terminals CK of the even-numbered stages are applied with the second clock signal CKVB. The first clock signal CKV and the second clock signal CKVB are clock signals having opposite phases to each other.

The first voltage input terminal Vin1 is applied with the first low voltage Vss1 corresponding to the gate-off voltage. The second voltage input terminal Vin2 is applied with the second low voltage Vss2 that is lower than the first low voltage Vss1. The voltage values of the first low voltage Vss1 and the second low voltage Vss2 may vary according to the exemplary embodiment. The value of the first low voltage Vss1 is −5V and the value of the second low voltage Vss2 is −10V in the present exemplary embodiment.

Next, the operation of the gate driver 500 will be described in more detail.

The first stage SR1 receives the first clock signal CKV provided from outside external to the clock input terminal CK, the scan start signal STVP through the first input terminal IN1, the first and second low voltages Vss1, Vss2 through the first and second voltage input terminals Vin1, Vin2, and the transmission signals CR respectively provided from the second stage SR2 and the third stage SR3 through the second and third input terminals IN2, IN3 such that the gate-on voltage is output to the first gate line through the gate voltage output terminal OUT. Also, the transmission signal output terminal CRout outputs the transmission signal CR, and it is transmitted to the first input terminal IN1 of the second stage SR2.

The second stage SR2 receives the second clock signal CKVB provided from the outside to the clock input terminal CK, the transmission signal CR of the first stage SR1 through the first input terminal IN1, the first and second low voltages Vss1, Vss2 through the first and second voltage input terminals Vin1, Vin2, and the transmission signals CR respectively provided from the third stage SR3 and the fourth stage SR4 through the second and third input terminals IN2, IN3 such that the gate-on voltage is output to the second gate line through the gate voltage output terminal OUT. Also, the transmission signal CR is output through the transmission signal output terminal CRout, thereby being transmitted to the first input terminal IN1 of the third stage SR3 and the second input terminal IN2 of the first stage SR1.

The third stage SR3 receives the first clock signal CKV provided from the outside to the clock input terminal CK, the transmission signal CR of the second stage SR2 through the first input terminal IN1, the first and second low voltages Vss1, Vss2 through the first and second voltage input terminals Vin1, Vin2, and the transmission signals CR respectively provided from the fourth stage SR4 and the fifth stage SR5 through the second and third input terminals IN2, IN3 such that the gate-on voltage is output to the third gate line through the gate voltage output terminal OUT. Also, the transmission signal CR is output through the transmission signal output terminal CRout thereby being transmitted to the first input terminal IN1 of the fourth stage SR4, the third input terminal IN3 of the first stage SR1, and the second input terminal IN2 of the second stage SR2.

Through the above method, The n-th stage SRn receives the second clock signal CKVB provided from the outside to the clock input terminal CK, the transmission signal CR of the n−1-th stage SRn-1 through the first input terminal IN1, the first and second low voltages Vss1, Vss2 through the first and second voltage input terminals Vin1, Vin2, and the transmission signals CR respectively provided from the (n+1)-th stage SRn+1 (the dummy stage) and the (n+2)-th stage SRn+2 (the dummy stage) through the second and third input terminals IN2, IN3 such that the gate-on voltage is output to the n-th gate line through the gate voltage output terminal OUT. Also, the transmission signal CR is output through the transmission signal output terminal CRout thereby being transmitted to the first input terminal IN1 of the (n+1)-th stage SRn+1 (the dummy stage), the third input terminal IN3 of the (n−2)-th stage SRn-2, and the second input terminal IN2 of the n−1-th stage SRn-1.

The connection structure of the stages SR of the whole gate driver 500 has been described with reference to FIG. 6. Next, a structure of a stage SR of a gate driver connected to one gate line will be described in further detail with reference to FIG. 7.

Figure 7:
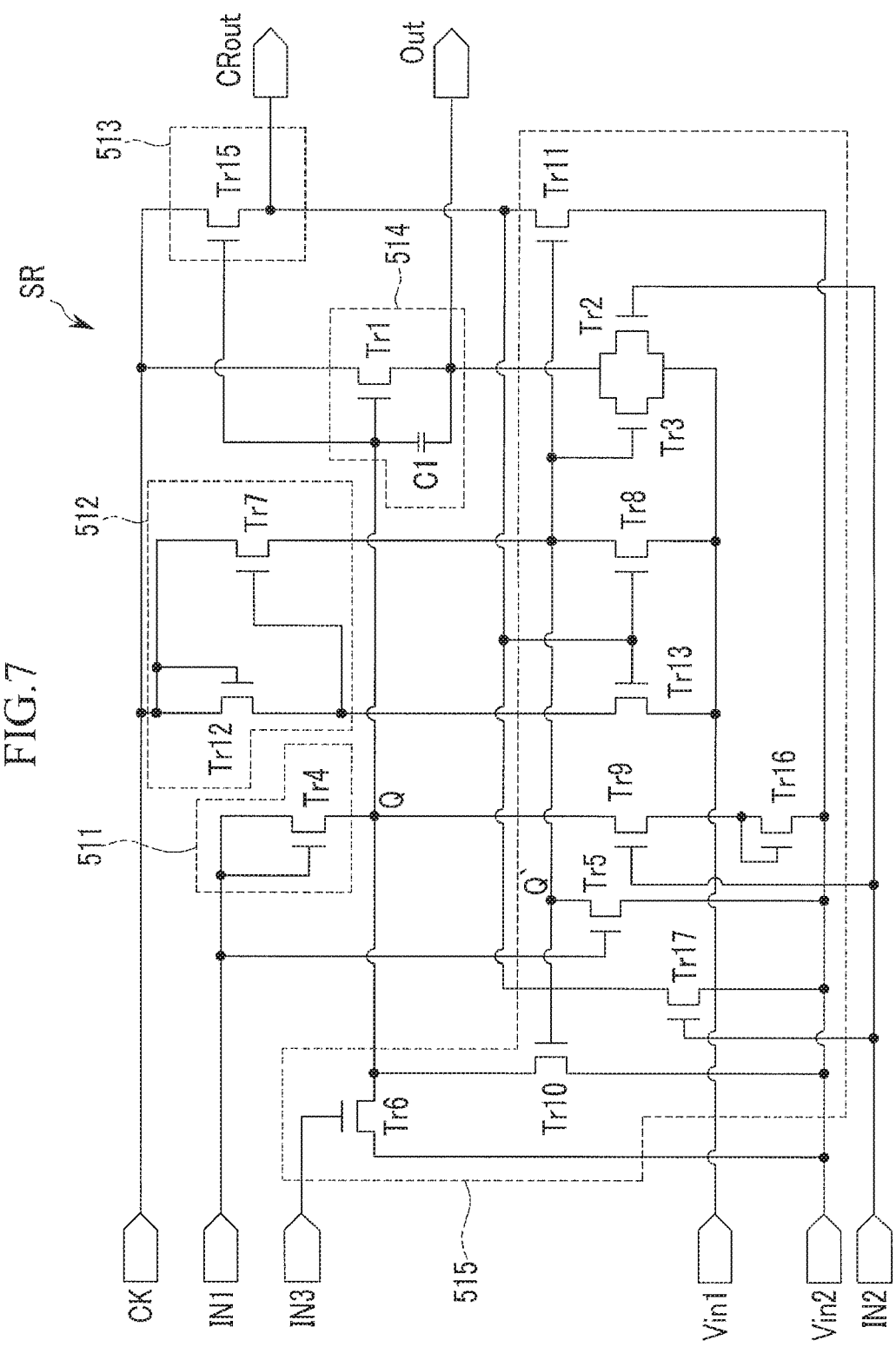
FIG. 7 is a circuit diagram of one stage and one gate line in FIG. 6.

FIG. 7 is a circuit diagram of one stage SR and one gate line in FIG. 6. Each stage SR of the gate driver 500 according to the present exemplary embodiment includes an input section 511, a pull-up driver 512, a transmission signal generator 513, an output section 514, and a pull-down driver 515.

The input section 511 includes one transistor (the fourth transistor Tr4). The input terminal and the control terminal of the fourth transistor Tr4 are commonly connected (diode-connected) to the first input terminal IN1. The output terminal thereof is connected to a node Q (hereinafter referred to as the first node). The input section 511 has a function of transmitting the high voltage to the node Q when the first input terminal IN1 is applied with the high voltage.

The pull-up driver 512 includes two transistors (the seventh transistor Tr7 and the twelfth transistor Tr12). The control terminal and the input terminal of the twelfth transistor Tr12 are diode-connected thereby receiving the first clock signal CKV or the second clock signal CKVB through the clock terminal CK. The output terminal is connected to the control terminal of the seventh transistor Tr7 and the pull-down driver 515. The input terminal of the seventh transistor Tr7 is also connected to the clock terminal CK. The output terminal is connected to the node Q' (hereinafter referred to as the second node) and is passed through the node Q' thereby being connected to the pull-down driver 515. The control terminal of the seventh transistor Tr7 is connected to the output terminal of the twelfth transistor Tr12 and the pull-down driver 515. Here, a parasitic capacitor (not shown) may be respectively formed between the input terminal and the control terminal, and the control terminal and the output terminal, of the seventh transistor Tr7. If the pull-up driver 512 is applied with the high signal at the clock terminal CK, and the high signal is transmitted to the control terminal of the seventh transistor Tr7 and the pull-down driver 515 through the twelfth transistor Tr12. The high signal transmitted to the seventh transistor Tr7 turns on the seventh transistor Tr7, and as a result the high signal applied from the clock terminal CK is applied to the node Q'.

The transmission signal generator 513 includes one transistor (the fifteenth transistor Tr15). The input terminal of the fifteenth transistor Tr15 is connected to the clock terminal CK thereby receiving the first clock signal CKV or the second clock signal CKVB. The control terminal thereof is connected to the output terminal of the input section 511, that is, the node Q, and the output terminal thereof is connected to the transmission signal output terminal CRout that outputs the transmission signal CR. Here, a parasitic capacitor (not shown) may be formed between the control terminal and the output terminal. The output terminal of the fifteenth transistor Tr15 is connected to the pull-down driver 515 as well as the transmission signal output terminal CRout, thereby receiving the second low voltage Vss2. As a result, the voltage value when the transmission signal CR is low is the second low voltage Vss2.

The output section 514 includes one transistor (the first transistor Tr1) and one capacitor (the first capacitor C1). The control terminal of the first transistor Tr1 is connected to the node Q, the input terminal thereof receives the first clock signal CKV or the second clock signal CKVB through the clock terminal CK, the first capacitor C1 is formed between the control terminal and the output terminal, and the output terminal thereof is connected to the gate voltage output terminal OUT. Also, the output terminal is connected to the pull-down driver 515 thereby receiving the first low voltage Vss1. As a result, the value of the voltage of the gate-off voltage is the first low voltage Vss1. This output section 514 outputs the gate voltage according to the voltage of the node Q and the first clock signal CKV.

The pull-down driver 515 removes charges remaining at the stage SR as the portion to smoothly output the gate-off voltage and the low voltage of the transmission signal CR thereby executing functions of decreasing the potential of the node Q, the potential of the node Q', the voltage output to the transmission signal CRout, and the voltage output to the gate line. The pull-down driver 515 includes eleven transistors (the second transistor Tr2, the third transistor Tr3, the fifth transistor Tr5, the sixth transistor Tr6, the eighth transistor Tr8 to the eleventh transistor Tr11, the thirteenth transistor Tr13, the sixteenth transistor Tr16, and the seventeenth transistor Tr17).

First, the transistors that pull down the node Q will be described. The transistors that pull down the node Q are the sixth transistor Tr6, the ninth transistor Tr9, the tenth transistor Tr10, and the sixteenth transistor Tr16.

The control terminal of the sixth transistor Tr6 is connected to the third input terminal IN3. The output terminal thereof is connected to the second voltage input terminal Vin2. The input terminal thereof is connected to the node Q. Therefore, the sixth transistor Tr6 is turned on according to the transmission signal CR applied from the second next stage, thereby having the function of decreasing the voltage of the node Q to the second low voltage Vss2.

The ninth transistor Tr9 and the sixteenth transistor Tr16 are operated together thereby pulling down the node Q. The control terminal of the ninth transistor Tr9 is connected to the second input terminal IN2. The input terminal thereof is connected to the node Q. The output terminal thereof is connected to the input terminal and the control terminal of the sixteenth transistor Tr16. The control terminal and the input terminal of the sixteenth transistor Tr16 are diode-connected to the output terminal of the ninth transistor Tr9. The output terminal thereof is connected to the second voltage input terminal Vin2. Therefore, the ninth transistor Tr9 and the sixteenth transistor Tr16 are turned on according to the transmission signal CR applied from the next stage, thereby executing the function of decreasing the voltage of the node Q to the second low voltage Vss2.

The input terminal of the tenth transistor Tr10 is connected to the node Q. The output terminal thereof is connected to the second voltage input terminal Vin2. The control terminal thereof is connected to the node Q' (that has the reverse voltage to the node Q such that it is referred to as a reverse terminal). Therefore, the tenth transistor Tr10 has the function of continuously decreasing the voltage of the node Q to the second low voltage Vss2 in the general period that the node Q' has the high voltage and then not decreasing the voltage of the node Q when the voltage of the node Q' is only the low voltage. When the voltage of the node Q is not decreased, the corresponding stage outputs the gate-on voltage and the transmission signal CR.

The transistor that pulls-down the node Q' in the pull-down driver 515 will now be described. The transistors that pull down the node Q' are the fifth transistor Tr5, the eighth transistor Tr8, and the thirteenth transistor Tr13.

The control terminal of the fifth transistor Tr5 is connected to the first input terminal IN1. The input terminal thereof is connected to the node Q'. The output terminal thereof is connected to the second voltage input terminal Vin2. As a result, the fifth transistor Tr5 decreases the voltage of the node Q' to the second low voltage Vss2 according to the transmission signal CR of the previous stage.

The eighth transistor Tr8 has the control terminal connected to the transmission signal output terminal CRout of the corresponding stage, the input terminal connected to the node Q', and the output terminal connected to the first voltage input terminal Vin1. As a result, the eighth transistor Tr8 functions to decrease the voltage of the node Q' to the first low voltage Vss1 according to the transmission signal CR of the corresponding stage.

The thirteenth transistor Tr13 has the control terminal connected to the transmission signal output terminal CRout of the corresponding stage, the input terminal connected to the output terminal of the twelfth transistor Tr12 of the pull-up driver 512, and the output terminal connected to the first voltage input terminal Vin1. As a result, the thirteenth transistor Tr13 functions to decrease the inner potential of the pull-up driver 512 to the first low voltage Vss1 and to decrease the voltage of the node Q' connected to the pull-up driver 512 to the first low voltage Vss1 according to the transmission signal CR of the corresponding stage. That is, the thirteenth transistor Tr13 strictly functions to discharge the inner charges of the pull-up driver 512 to the first low voltage Vss1. However, the pull-up driver 512 is also connected to the node Q' for the voltage of the node Q' to not be pulled up such that the thirteenth transistor Tr13 assists to decrease the voltage of the node Q' to the first low voltage Vss1.

Different from the exemplary embodiment of FIG. 3, the eighth transistor Tr8 and the thirteenth transistor Tr13 are connected to the first voltage input terminal Vin1 applied with the first low voltage Vss1 in the exemplary embodiment of FIG. 7.

The transistors decreasing the voltage output to the transmission signal CRout in the pull-down driver 515 will now be described. The transistors decreasing the voltage output to the transmission signal CRout are the eleventh transistor Tr11 and the seventeenth transistor Tr17.

The eleventh transistor Tr11 has the control terminal connected to the node Q', the input terminal connected to the transmission signal output terminal CRout, and the output terminal connected to the second voltage input terminal Vin2. As a result, when the voltage of the node Q' is high, the voltage of the transmission signal output terminal CRout is decreased to the second low voltage Vss2, and as a result the transmission signal CR is changed to the low level.

The seventeenth transistor Tr17 that is not included in the exemplary embodiment of FIG. 3 has the control terminal connected to the second input terminal IN2, the input terminal connected to the transmission signal output terminal CRout, and the output terminal connected to the second voltage input terminal Vin2. As a result, it has the function of decreasing the voltage of the transmission signal output terminal CRout to the second low voltage Vss2 according to the transmission signal CR of the next stage. To assist the operation of the eleventh transistor Tr11, the seventeenth transistor Tr17 is operated based upon the transmission signal CR of the next stage.

The transistors decreasing the voltage output to the gate line from the pull-down driver 515 will now be described. The transistors decreasing the voltage output to the gate line are the second transistor Tr2 and the third transistor Tr3.

The second transistor Tr2 has the control terminal connected to the second input terminal IN2, the input terminal connected to the gate voltage output terminal OUT, and the output terminal connected to the first voltage input terminal Vin1. As a result, the gate voltage output when the transmission signal CR of the next stage is output is changed to the first low voltage Vss1.

The third transistor Tr3 has the control terminal connected to the node Q', the input terminal connected to the gate voltage output terminal OUT, and the output terminal connected to the first voltage input terminal Vin1. As a result, the gate voltage output when the voltage of the node Q' is high is changed to the first low voltage Vss1.

In pull-down driver 515, the operation of decreasing the voltage output to the transmission signal CRout and the operation of decreasing the voltage output to the gate line are executed through two transistors, and they are connected to the second input terminal IN2 such that they are operated according to the transmission signal CR of the next stage or the voltage of the node Q', thereby may be operated with the same timing. However, the voltage output to the transmission signal CRout is decreased to the second low voltage Vss2, and the gate-off voltage is decreased to the first low voltage Vss1 such that the voltage when the transmission signal CR is low is lower than the gate-off voltage.

In the pull-down driver 515, the gate voltage output terminal OUT is only decreased to the first low voltage Vss1, and the node Q and the transmission signal output terminal CRout are decreased to the second low voltage Vss2 that is lower than the first low voltage Vss1. As a result, although the gate-on voltage and the high voltage of the transmission signal CR may by the same voltage, the gate-off voltage and the low voltage of the transmission signal CR are different voltages. That is, the gate-off voltage is the first low voltage Vss1, and the low voltage of the transmission signal CR is the second low voltage Vss2. On the other hand, the node Q' is decreased to the first low voltage Vss1 by the eighth transistor Tr8 and the thirteenth transistor Tr13, and to the second low voltage Vss2 by the fifth transistor Tr5.

The gate voltage and transmission signal CR may have the various voltage values, however in the present exemplary embodiment, the gate-on voltage is 25V, the gate-off voltage and the first low voltage Vss1 are −5V, the high voltage of the transmission signal CR is 25V, and the low voltage and the second low voltage Vss2 are −10V.

In summary, the transmission signal generator 513 and the output section 514 are operated by the voltage of the node Q such that one stage SR outputs the high voltage of the transmission signal CR and the gate-on voltage. The transmission signal CR is decreased from the high voltage to the second low voltage Vss2 by the previous, the next, and the second next transmission signal CR, and the gate-on voltage is decreased to the first low voltage Vss1 thereby being the gate-off voltage. Here, one stage SR decreases the voltage of the node Q to the second low voltage Vss2 by the second next transmission signal CR as well as the next transmission signal CR to reduce the power consumption. The second low voltage Vss2 is lower than the first low voltage Vss1 as the gate-off voltage such that the second low voltage Vss2 is sufficiently low such that the transistors included in the stage hardly flow out any leakage current such that there is the benefit that the power consumption is decreased although the transmission signal CR applied in the different stage includes a ripple or noise and the voltage is changed.

Figure 8:
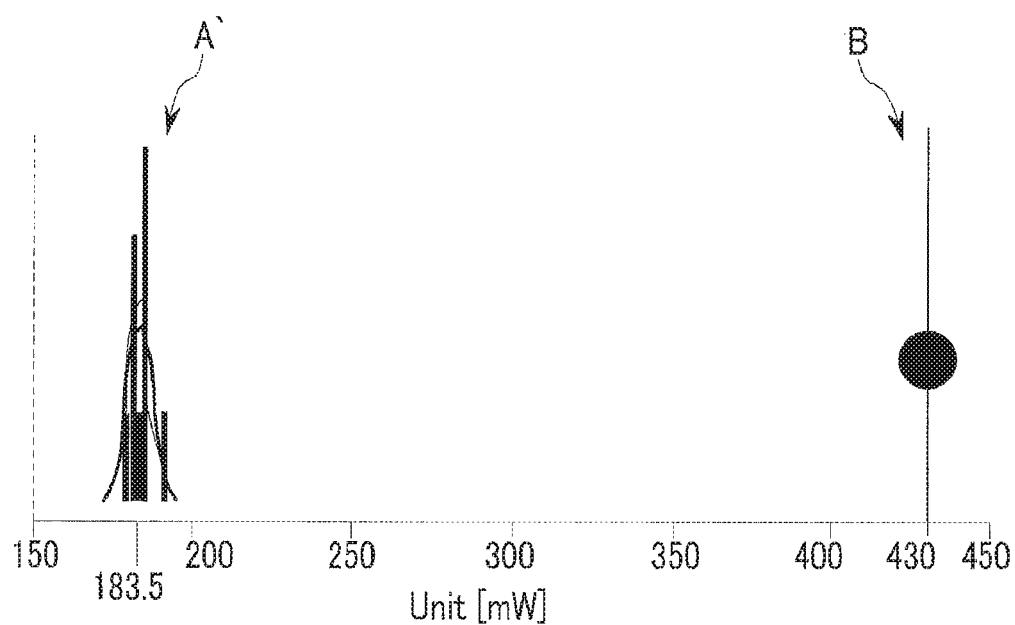
FIG. 8 is a graph comparing power consumption when using the exemplary embodiment of FIG. 7 with power consumption according to the conventional art.

FIG. 8 is a graph showing power consumption of the gate driver 500 according to the exemplary embodiment of FIG. 7. "A" depicts power consumption of the exemplary embodiment of FIG. 7, and "B" is power consumption of the conventional art. "A" is represented as a plurality of bar graphs, which means the results are measured through a plurality of exemplary embodiments, and 183.5 mW is an average power consumption of the exemplary embodiment of FIG. 7. On the other hand, it is typically known that the power consumption of the gate driver according to the conventional art is 430 mW. Accordingly, the power consumption can be reduced by more than half in accordance with the exemplary embodiment of the present invention.

As compared with FIG. 4, the average power consumption of the exemplary embodiment of FIG. 7 is 183.5 mW wherein the average power consumption is less than that of the exemplary embodiment of FIG. 3 whose average power consumption is 189 mW. The transmission signal output terminal CRout is changed to the low voltage at the same timing as the gate voltage output terminal Out by adding the seventeenth transistor Tr17 such that the leakage current may be further reduced inside the circuit.

The transistors Tr1-Tr13, and Tr15 to Tr17 formed in the stage SR may be NMOS transistors. When the transistors Tr1-Tr13, and Tr15 to Tr17 are formed as PMOS transistors, the transistors Tr1-Tr13, and Tr15 to Tr17 may be on when the voltage applied to the control terminal is low.

As described above, the exemplary embodiment of FIG. 3 may be applied to both the exemplary embodiments (the case that the data driver is disposed at the upper side of the panel) of FIG. 1 and the exemplary embodiment (the case that the data driver is disposed at the lower side of the panel) of FIG. 5, and the exemplary embodiment of FIG. 7 may be applied to both the exemplary embodiment of FIG. 1 and the exemplary embodiment of FIG. 5. However, in the structure of the exemplary embodiment of FIG. 5, the first clock signal (CKV), the second clock signal (CKVB), the scan start signal (STVP), the first low voltage Vss1, and the second low voltage Vss2 applied according to the flexible printed circuit film FPC are moved from the lower side to the upper side. The gate-on voltage is applied from the first gate line G1 disposed at the upper side such that noise may be generated when the display panel is used for a long time at a high temperature. When respectively using the exemplary embodiment of FIG. 3 and the exemplary embodiment of FIG. 5, noise may be generated relatively more at the high temperature in the exemplary embodiment of FIG. 3 as compared with the exemplary embodiment of FIG. 5. This is the reason that the transmission signal CR is not again changed to the second low voltage Vss2 like the seventeenth transistor Tr17 such that the possibility of the generation of the ripple is high in the transmission signal CR. However, the possibility of the generation of noise at the high temperature in the exemplary embodiment of FIG. 3 is remarkably low as compared with the conventional gate driver.

Next, power consumption, a high temperature characteristic, a low temperature characteristic, and a lifespan will be described focusing on the exemplary embodiment of FIG. 7 as compared with the conventional art.

Figure 9:
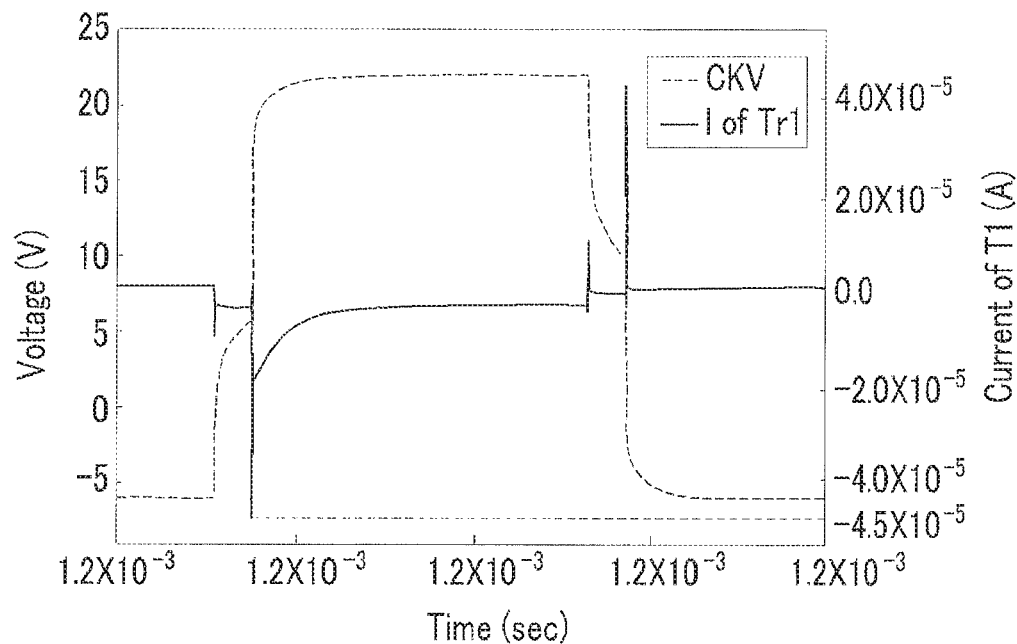
FIG. 9 is a graph showing current flowing in the first transistor that outputs a gate voltage in a gate driver according to the conventional art with reference to a clock signal CKV.
Figure 10:
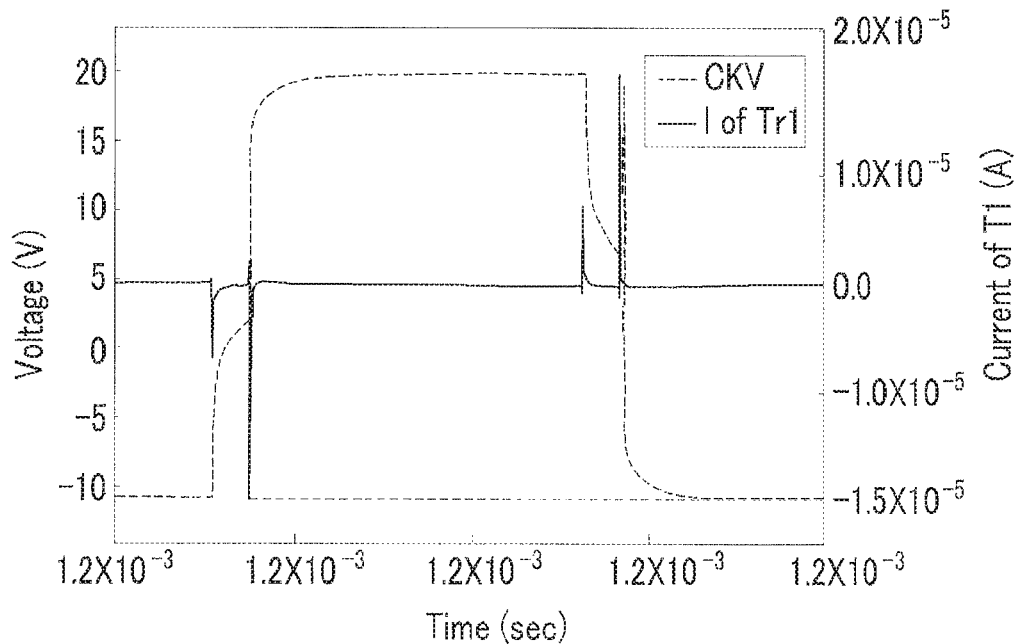
FIG. 10 is a graph showing current flowing in the first transistor that outputs a gate voltage in a gate driver according to the exemplary embodiment of FIG. 7 with reference to a clock signal CKV.

FIG. 9 is a graph showing current flow in the first transistor that outputs a gate voltage in a gate driver according to the conventional art with reference to a clock signal CKV voltage. FIG. 10 is a graph showing current flow in the first transistor that outputs a gate voltage in a gate driver according to the exemplary embodiment of FIG. 7 with reference to a clock signal CKV voltage.

As shown in FIG. 9, the current of the first transistor Tr1 of the gate driver according to the conventional art varies to a lower limit of about −45 μA in correspondence with a varying clock signal CKV. However, the current of the first transistor Tr1 of the gate driver of FIG. 7 as shown in FIG. 10 varies to a lower limit of about −15 μA. As a result, the current used at each stage SR is considerably smaller in the exemplary embodiment according to the present invention, and as a result the power consumption can be reduced by more than half. The reduction of power consumption by more than half is shown through FIGS. 4 and 8.

Next, the high temperature characteristics, the low temperature characteristics, and the lifespan characteristics will be described.

Figure 11:
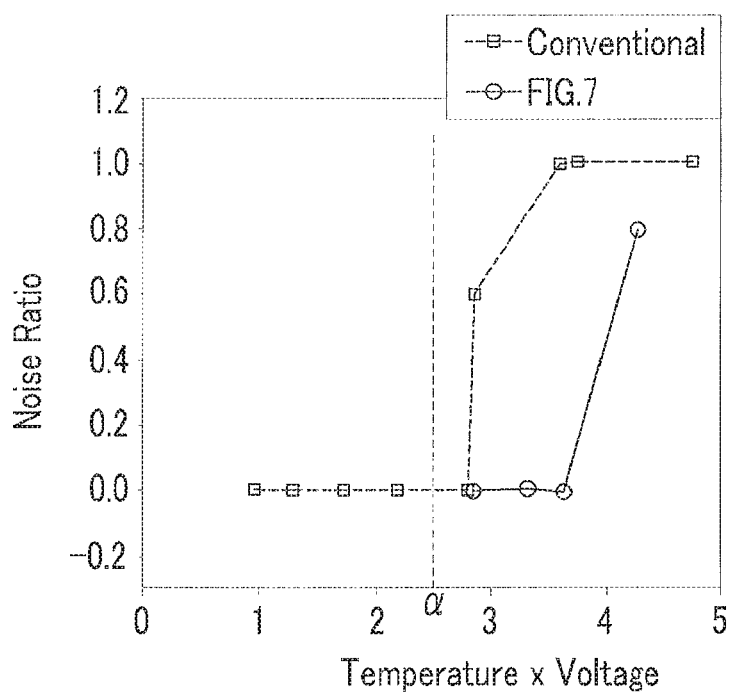
FIGS. 11, 12 and 13 are graphs showing characteristics at high temperature, characteristics at low temperature, and characteristics for a lifespan when using the exemplary embodiment of FIG. 7 as compared with the conventional art.

FIG. 11 is a graph showing characteristics at high temperature of the gate driver according to the conventional art and according to the exemplary embodiment of FIG. 7. The horizontal axis represents a normalization value of a voltage* a temperature, and the vertical axis represents a noise ratio. In FIG. 11, a value α is the reference available as the gate driver.

As shown in FIG. 11, there is no noise for the general reference of the value α in the conventional art and the exemplary embodiment according to the present invention. However, if the values of the high temperature and the voltage used for the gate driver according to the conventional art are slightly over the reference α, the noise is steeply increased. In contrast, the gate driver according to FIG. 7 still does not include the noise in the predetermined range. The exemplary embodiment of FIG. 3 has the characteristics corresponding to the exemplary embodiment of FIG. 7. Therefore, the gate driver according to the present invention can improve the high temperature characteristics.

Figure 12:
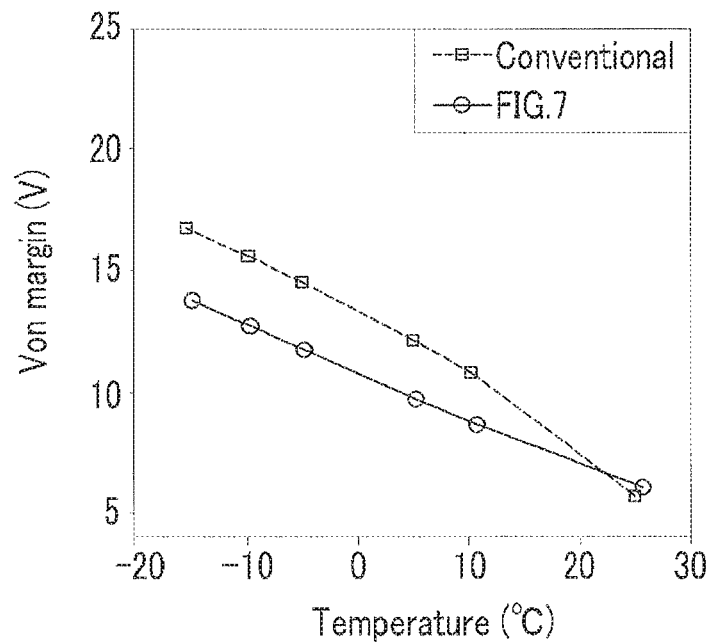

FIG. 12 is a graph comparing the low temperature characteristics of the gate drivers of the conventional art and of the exemplary embodiment of FIG. 7.

In FIG. 12, the horizontal axis represents temperature and the vertical axis represents a margin of the gate-on voltage Von. That is, it is shown that the gate driver is not operated at the voltage below the position represented in the graph.

As shown in FIG. 12, the conventional gate driver and the gate driver of FIG. 7 have the same margin of the gate-on voltage Von at room temperature. However, a difference of the margins of the gate-on voltage Von is generated further closer to the low temperature and driving only by the low voltage is possible at the low temperature in the exemplary embodiment of FIG. 7. However, a relatively high voltage must be applied for the driving of the conventional gate driver. The exemplary embodiment of FIG. 3 has the characteristics corresponding to the exemplary embodiment of FIG. 7. Therefore, the gate driver according to the present invention may improve the low temperature characteristics as compared with the conventional art.

Figure 13:
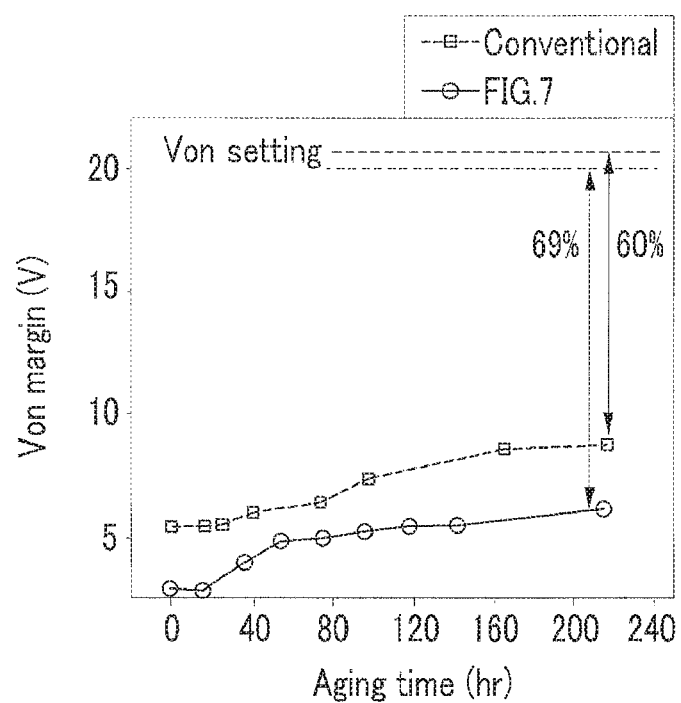

FIG. 13 is a graph comparing the lifespan characteristics of the gate drivers of the conventional art and of the exemplary embodiment of FIG. 7. The horizontal axis represents an aging time and the vertical axis represents a margin of the gate-on voltage Von. In FIG. 13, a Von setting value represents a voltage setting value that is generally used in the gate driver. If the voltage of the graph is higher than the Von setting value, the gate driver can not be operated by the general applied voltage, and as a result the lifespan of the gate driver is over.

In an experiment to obtain the graph of FIG. 13, a higher voltage (of about 130%) than the general voltage is applied to the gate driver to easily finish the lifespan, and the experiment is executed at a high temperature. As a result, experimental results of a long time can be obtained in short time.

In FIG. 13, the gate-on voltages Von of the conventional gate driver and the gate driver of the exemplary embodiment of FIG. 7 are both increased toward the Von setting value as time passes. However, the gate driver according to the conventional art after the passage of the time has a high value such that it may be predicted that the lifespan is finished quickly. Particularly, compared with the setting values after the passage of 200 hours in FIG. 13, although the setting value of the exemplary embodiment of FIG. 7 is low, a large difference of about 10% is generated. As a result, the lifespan is remarkably increased as compared with the gate driver according to the conventional art.

Although not shown in FIG. 13, the gate driver of FIG. 3 and FIG. 7 according to the exemplary embodiments of the present invention passes the lifespan test at more than 5000 hours.

While the present invention has been described in connection with what is presently considered to be practical exemplary embodiments, it is to be understood that the invention is not limited to the disclosed embodiments, but, on the contrary, is intended to also cover various modifications and equivalent arrangements included within the spirit and scope of the appended claims.

What is claimed is:

1. A display device comprising:
a display area including a gate line;
a gate driver connected to an end of the gate line, the gate driver including a plurality of stages and being integrated on a substrate,
wherein a stage of the plurality of stages comprises:
a clock input terminal to which a clock signal is input;
a first low voltage terminal to which a first low voltage is input;
a second low voltage terminal to which a second low voltage is input, the second low voltage being different from the first low voltage;
a first input terminal to which at least one transmission signal from a previous stage is input;
a gate voltage output terminal which outputs a gate signal including a gate-off voltage and a gate-on voltage;
a first transistor including a control terminal connected to a first node, an input terminal connected to the clock input terminal, and an output terminal connected to the gate voltage output terminal;
a third transistor including a control terminal connected to a second node, an input terminal connected to the gate voltage output terminal, and an output terminal connected to the first low voltage terminal;
a fifth transistor including a control terminal connected to the first input terminal, an input terminal connected to the second low voltage terminal, and an output terminal connected the second node; and
a tenth transistor including a control terminal, an input terminal, and an output terminal, wherein the input terminal of the tenth transistor is connected to the second low voltage terminal, and the output terminal of the tenth transistor is connected to the first node,
wherein a voltage level of the gate-off voltage includes the first low voltage.

2. The display device of claim 1, wherein the control terminal of the tenth transistor is connected to the second node.

3. The display device of claim 1, wherein the stage further comprises:
a second input terminal to which at least one transmission signal from one of next stages is input; and
a sixth transistor including a control terminal connected to the second input terminal, an input terminal connected to the second low voltage terminal, and an output terminal connected to the first node.

4. The display device of claim 3, wherein the stage further comprises:
a third input terminal to which at least one transmission signal from one of next stages is input; and
a second transistor including a control terminal connected to the third input terminal, an input terminal connected to the gate voltage output terminal, and an output terminal connected to the first low voltage terminal.

5. The display device of claim 4, wherein the stage further comprises:
a ninth transistor including a control terminal connected to the third input terminal, and an input terminal connected to the first node; and
a sixteenth transistor including a control terminal and an input terminal that are connected to an output terminal of the ninth transistor, and an output terminal connected to the second low voltage terminal.

6. The display device of claim 1, wherein the stage further comprises:
a transmission signal output terminal which outputs a transmission signal of the stage; and
an eleventh transistor including a control terminal connected to the second node, an input terminal connected to the transmission signal output terminal, and an output terminal connected to the second low voltage terminal.

7. The display device of claim 1, wherein a voltage level of the gate-off voltage does not include the second low voltage.

8. A display device comprising:
a display area including a gate line;
a gate driver connected to an end of the gate line, the gate driver including a plurality of stages and being integrated on a substrate,
wherein a stage of the plurality of stages comprises:
a clock input terminal to which a clock signal is input;
a first low voltage terminal to which a first low voltage is input;
a second low voltage terminal to which a second low voltage is input, the second low voltage being different from the first low voltage;
a first input terminal to which at least one transmission signal from a previous stage is input;
a second input terminal to which at least one transmission signal from one of next stages is input;
a gate voltage output terminal which outputs a gate signal including a gate-off voltage and a gate-on voltage;
a first transistor including a control terminal connected to a first node, an input terminal connected to the clock input terminal, and an output terminal connected to the gate voltage output terminal;
a third transistor including a control terminal connected to a second node, an input terminal connected to the gate voltage output terminal, and an output terminal connected to the first low voltage terminal;
a sixth transistor including a control terminal connected to the second input terminal, an input terminal connected to the second low voltage terminal, and an output terminal connected to the first node; and
a fifth transistor including a control terminal, an input terminal, and an output terminal, wherein the input terminal of the fifth transistor is connected to the second low voltage terminal, and the output terminal of the fifth transistor is connected to the second node,
wherein a voltage level of the gate-off voltage includes the first low voltage.

9. The display device of claim 8, wherein the control terminal of the fifth transistor is connected to the first input terminal.

10. The display device of claim 8, wherein the stage further comprises:
a tenth transistor including a control terminal connected to the second node, an input terminal connected to the second low voltage terminal, and an output terminal connected to the first node.

11. The display device of claim 8, wherein the stage further comprises:
a third input terminal to which at least one transmission signal from one of next stages is input; and
a second transistor including a control terminal connected to the third input terminal, an input terminal connected to the gate voltage output terminal, and an output terminal connected to the first low voltage terminal.

12. The display device of claim 11, wherein the stage further comprises:
a ninth transistor including a control terminal connected to the third input terminal, and an input terminal connected to the first node; and
a sixteenth transistor including a control terminal and an input terminal that are connected to an output terminal of the ninth transistor, and an output terminal connected to the second low voltage terminal.

13. The display device of claim 8, wherein the stage further comprises:
a transmission signal output terminal which outputs a transmission signal of the stage; and
an eleventh transistor including a control terminal connected to the second node, an input terminal connected to the transmission signal output terminal, and an output terminal connected to the second low voltage terminal.

14. The display device of claim 8, wherein a voltage level of the gate-off voltage does not include the second low voltage.

15. A display device comprising:
a display area including a gate line;
a gate driver connected to an end of the gate line, the gate driver including a plurality of stages and being integrated on a substrate,
wherein a stage of the plurality of stages comprises:
a clock input terminal to which a clock signal is input;
a first low voltage terminal to which a first low voltage is input;
a second low voltage terminal to which a second low voltage is input, the second low voltage being different from the first low voltage;
a first input terminal to which at least one transmission signal from a previous stage is input;
a gate voltage output terminal which outputs a gate signal including a gate-off voltage and a gate-on voltage;
a first transistor including a control terminal connected to a first node, an input terminal connected to the clock input terminal, and an output terminal connected to the gate voltage output terminal;
a third transistor including a control terminal connected to a second node, an input terminal connected to the gate voltage output terminal, and an output terminal connected to the first low voltage terminal;
a tenth transistor including a control terminal connected to the second node, an input terminal connected to the second low voltage terminal, and an output terminal connected to the first node;
a transmission signal output terminal which outputs a transmission signal of the stage; and
an eleventh transistor including a control terminal connected to the second node, an input terminal connected to the transmission signal output terminal, and an output terminal connected to the second low voltage terminal,
wherein a voltage level of the gate-off voltage includes the first low voltage.

16. The display device of claim 15, wherein the stage further comprises:
a fifth transistor including a control terminal connected to the first input terminal, an input terminal connected to the second low voltage terminal, and an output terminal connected the second node.

17. The display device of claim 15, wherein the stage further comprises:
a second input terminal to which at least one transmission signal from one of next stages is input; and
a sixth transistor including a control terminal connected to the second input terminal, an input terminal connected to the second low voltage terminal, and an output terminal connected to the first node.

18. The display device of claim 17, wherein the stage further comprises:
a third input terminal to which at least one transmission signal from one of next stages is input; and
a second transistor including a control terminal connected to the third input terminal, an input terminal connected to the gate voltage output terminal, and an output terminal connected to the first low voltage terminal.

19. The display device of claim 18, wherein the stage further comprises:
a ninth transistor including a control terminal connected to the third input terminal, and an input terminal connected to the first node; and
a sixteenth transistor including a control terminal and an input terminal that are connected to an output terminal of the ninth transistor, and an output terminal connected to the second low voltage terminal.

20. A display device comprising:
a display area including a gate line;
a gate driver connected to an end of the gate line, the gate driver including a plurality of stages and being integrated on a substrate,
wherein a stage of the plurality of stages comprises:
a clock input terminal to which a clock signal is input;
a first low voltage terminal to which a first low voltage is input;
a second low voltage terminal to which a second low voltage is input, the second low voltage being different from the first low voltage;
a first input terminal to which at least one transmission signal from a previous stage is input;
a second input terminal to which at least one transmission signal from one of next stages is input;
a gate voltage output terminal which outputs a gate signal including a gate-off voltage and a gate-on voltage;
a first transistor including a control terminal connected to a first node, an input terminal connected to the clock input terminal, and an output terminal connected to the gate voltage output terminal;
a third transistor including a control terminal connected to a second node, an input terminal connected to the gate voltage output terminal, and an output terminal connected to the first low voltage terminal; and
a sixth transistor including a control terminal connected to the second input terminal, an input terminal connected to the second low voltage terminal, and an output terminal connected to the first node; and
wherein a voltage level of the gate-off voltage includes the first low voltage, and
wherein the voltage level of the second node includes the second low voltage.

21. The display device of claim 20, wherein the stage further comprises:
a fifth transistor including a control terminal connected to the first input terminal, an input terminal connected to the second low voltage terminal, and an output terminal connected the second node.

22. The display device of claim 20, wherein the stage further comprises:
a tenth transistor including a control terminal connected to the second node, an input terminal connected to the second low voltage terminal, and an output terminal connected to the first node.

23. The display device of claim 20, wherein the stage further comprises:
a third input terminal to which at least one transmission signal from one of next stages is input; and
a second transistor including a control terminal connected to the third input terminal, an input terminal connected to the gate voltage output terminal, and an output terminal connected to the first low voltage terminal.

24. The display device of claim 23, wherein the stage further comprises:
a ninth transistor including a control terminal connected to the third input terminal, and an input terminal connected to the first node; and
a sixteenth transistor including a control terminal and an input terminal that are connected to an output terminal of the ninth transistor, and an output terminal connected to the second low voltage terminal.

25. The display device of claim 20, wherein the stage further comprises:
a transmission signal output terminal which outputs a transmission signal of the stage; and
an eleventh transistor including a control terminal connected to the second node, an input terminal connected to the transmission signal output terminal, and an output terminal connected to the second low voltage terminal.

26. The display device of claim 20, wherein a voltage level of the gate-off voltage does not include the second low voltage.

27. A display device comprising:
a display area including a gate line;
a gate driver connected to an end of the gate line, the gate driver including a plurality of stages and being integrated on a substrate,
wherein a stage of the plurality of stages comprises:
a clock input terminal to which a clock signal is input;
a first low voltage terminal to which a first low voltage is input;
a second low voltage terminal to which a second low voltage is input, the second low voltage being different from the first low voltage;
a first input terminal to which at least one transmission signal from a previous stage is input;
a gate voltage output terminal which outputs a gate signal including a gate-off voltage and a gate-on voltage;
a first transistor including a control terminal connected to a first node, an input terminal connected to the clock input terminal, and an output terminal connected to the gate voltage output terminal;
a third transistor including a control terminal connected to a second node, an input terminal connected to the gate voltage output terminal, and an output terminal connected to the first low voltage terminal; and
a tenth transistor including a control terminal connected to the second node, an input terminal connected to the second low voltage terminal, and an output terminal connected to the first node,
wherein a voltage level of the gate-off voltage includes the first low voltage, and
wherein the voltage level of the second node includes the second low voltage.

28. The display device of claim 27, wherein the stage further comprises:
a fifth transistor including a control terminal connected to the first input terminal, an input terminal connected to the second low voltage terminal, and an output terminal connected the second node.

29. The display device of claim 27, wherein the stage further comprises:
a second input terminal to which at least one transmission signal from one of next stages is input; and
a sixth transistor including a control terminal connected to the second input terminal, an input terminal connected to the second low voltage terminal, and an output terminal connected to the first node.

30. The display device of claim 29, wherein the stage further comprises:
a third input terminal to which at least one transmission signal from one of next stages is input; and
a second transistor including a control terminal connected to the third input terminal, an input terminal connected to the gate voltage output terminal, and an output terminal connected to the first low voltage terminal.

31. The display device of claim 30, wherein the stage further comprises:
a ninth transistor including a control terminal connected to the third input terminal, and an input terminal connected to the first node; and
a sixteenth transistor including a control terminal and an input terminal that are connected to an output terminal of the ninth transistor, and an output terminal connected to the second low voltage terminal.

32. The display device of claim 27, wherein the stage further comprises:
a transmission signal output terminal which outputs a transmission signal of the stage; and
an eleventh transistor including a control terminal connected to the second node, an input terminal connected to the transmission signal output terminal, and an output terminal connected to the second low voltage terminal.

* * * * *